United States Patent [19]

Lee et al.

[11] Patent Number: 5,357,530
[45] Date of Patent: Oct. 18, 1994

[54] DATA OUTPUT CONTROL CIRCUIT

[75] Inventors: Hyong-Gon Lee; Sung-Hee Cho, both of Suwon, Rep. of Korea

[73] Assignee: SamSung Electronics Co., Ltd., Suwon, Rep. of Korea

[21] Appl. No.: 934,249

[22] Filed: Aug. 25, 1992

[30] Foreign Application Priority Data

Oct. 28, 1991 [KR] Rep. of Korea ............... 1991-18997

[51] Int. Cl.$^5$ ............................................. G06F 11/10
[52] U.S. Cl. .................................. 371/40.1; 371/40.2; 371/40.3; 371/20.1; 371/21.1; 365/189.05
[58] Field of Search ................ 371/40.1, 40.2, 40.3, 371/40.4, 10.3, 20.1, 21.1, 22.1, 39.1, 31, 47.1; 365/189.05, 189.08, 203, 233.5, 225.6, 230.08, 190, 189.08; 370/53, 58.1

[56] References Cited

U.S. PATENT DOCUMENTS

| | | | |
|---|---|---|---|
| 4,719,595 | 1/1988 | Koinuma et al. | 365/189 |
| 4,766,573 | 8/1988 | Takemae | 371/40.1 |
| 4,918,692 | 4/1990 | Hidaka et al. | 371/40.1 |
| 4,928,265 | 5/1990 | Higuchi et al. | 365/189.05 |
| 4,937,830 | 6/1990 | Kawashima | 371/40.1 |
| 4,992,983 | 2/1991 | Suzuki | 365/189.05 |
| 5,003,542 | 3/1991 | Mashiko et al. | 371/40.1 |
| 5,051,955 | 9/1991 | Kobayashi | 365/189.02 |

*Primary Examiner*—Robert W. Beausoliel, Jr.
*Assistant Examiner*—Dieu-Minh Le
*Attorney, Agent, or Firm*—Robert E. Bushnell

[57] ABSTRACT

A data output control circuit of a semiconductor memory device. The data output control circuit comprises an input signal detector for detecting a desired signal, a controller for selecting one of a plurality of data output buffers and a data output controller for driving the selected data output buffer. A signal for driving and controlling the data output buffer is enabled after the data of a given memory cell is supplied to an input terminal of the data output buffer so that any unnecessary transition operation of data can be eliminated to reduce the current dissipation of a semiconductor memory chip and to prevent the deterioration of data access time for the purpose of improving the yield of the semiconductor memory chip.

19 Claims, 8 Drawing Sheets

DATA OUTPUT CONTROL CIRCUIT

BACKGROUND OF THE INVENTION

The present invention relates to semiconductor memory devices having error correction code (ECC), and more particularly, to a data output control circuit.

Recently, there has been an increased demand for semiconductor memory devices that are capable of having high integration and high storage capacity. As semiconductor memory devices are increasingly integrated to obtain greater storage capacity, the number of defects among the memory cells concomitantly increases to contribute to a low yield in the productivity of these semiconductor memory devices. In order to address problems of defects and low yield, a semiconductor memory device using an error correction code (hereinafter referred to as an ECC) has recently been proposed to correct errors occurring as a result of defective memory cells. An error correction code is a systematically constructed redundant code capable of correcting an error bit when an error occurs in those bits constituting a block code. In a semiconductor memory device with an error correction code circuit, high integration of the chip must be maintained identically during formation of the chip; and the characteristics of the chip, such as high speed operations, the suppression of current dissipation and the like, must be identical in a semiconductor memory device without the ECC circuit. The high speed operation and current dissipation of the chip are mainly determined by a data output control circuit. Therefore, the construction of the data output control circuit can assert substantial influence on the characteristics of the chip.

When a chip is operated, an operating current generated in the chip is increased during transitions between the input data and the output data, i.e., during a swing operation of the data to provide a large amount of operating current at output terminals. An increase in the operating current due to undesirable variations at the input/output terminals is detrimental to the effectiveness of the chip. The chip may be liable to malfunction. Moreover, the problem is exacerbated if the chip is highly integrated, especially in case of byte wide memory devices having a plurality of input/output terminals (×8, ×16, etc...). Moreover, the deterioration of access time is inevitably propagated in the chip with the normal state and abnormal state corrected by the ECC circuit, or in memory cells with the normal and abnormal states of a single chip due to undesirable variations at the input/output terminals, thereby resulting in low yield.

SUMMARY OF TITLE INVENTION

It is therefore an object of the instant invention to provide an improved semiconductor memory device.

It is another object to provide a semiconductor memory device with an error correction code circuit capable of suppressing incremental changes of operating current of a chip while enabling access to data at high speed.

It is another object of the invention to provide a semiconductor memory device with an error correction code circuit capable of improving the yield of a chip.

According to one aspect of the present invention, a semiconductor memory device with an error correction code circuit for detecting and correcting abnormal states of a memory cell. The semiconductor memory device with an error correction code circuit contemplates an input signal detector receiving a buffered external input signal through an input buffer to detect a transition signal, a controller receiving the output signal of the input signal detector and selecting a data output buffer to provide a control signal, and a data output controller receiving tile output signal of the controller to produce a driving signal for driving the data output buffer. Transitional operation of the data output buffer is performed in accordance with the output signal of tile data output controller. Moreover, the input signal detector, the controller and tile data output controller generate a signal for controlling the data output buffer.

BRIEF DESCRIPTION OF TITLE DRAWINGS

The advantages and features of the present invention will be more apparent from the detailed description hereunder, taken in conjunction with the attached drawings, in which.

DETAILED DESCRIPTION OF TITLE PREFERRED EMBODIMENT

Figure 1:
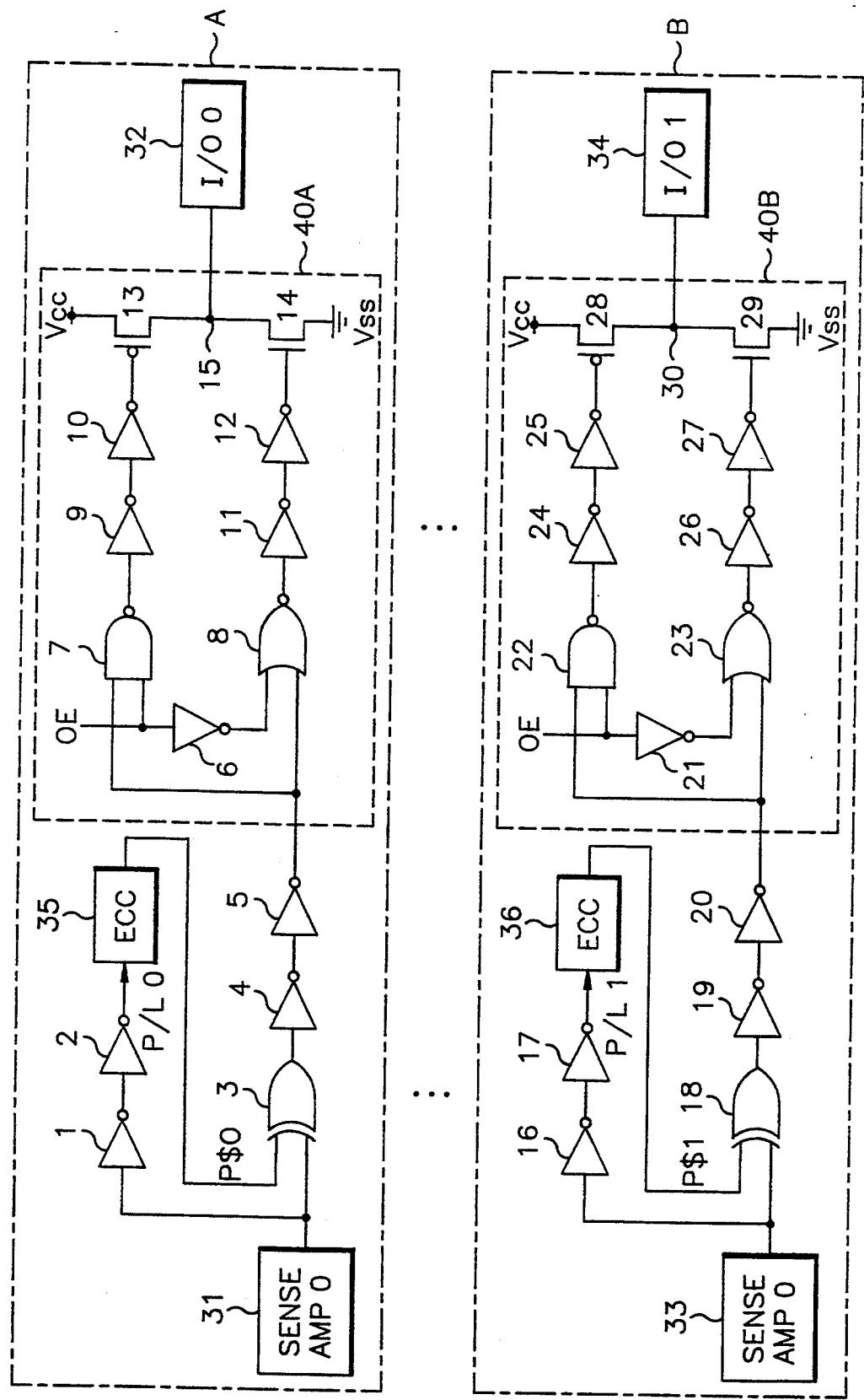
FIG. 1 is a circuit diagram of a conventional data output control circuit with error correction code circuits.

Referring now to the drawings, FIG. 1 is a circuit diagram of a conventional data output control circuit. Blocks A and B have the same configuration, and a plurality of blocks such as the blocks A and B are included in a chip. Blocks 40A and 40B are data output buffers and receive output signals of sense amplifiers 31 and 33 connected to memory cells, respectively. Moreover, the data output buffers 40A and 40B are controlled by a given output enable signal OE produced from an address transition detecting circuit (hereinafter referred to as an ATD circuit). The output signals of the sense amplifiers 31 and 33 are also applied to an ECC circuit. In the ECC circuit, a decoding operation is carried out, and output signals P$0 and P$1 of the ECC circuits 35 and 36 are transmitted to input terminals of exclusive OR gates 3 and 18 respectively.

Figure 2:
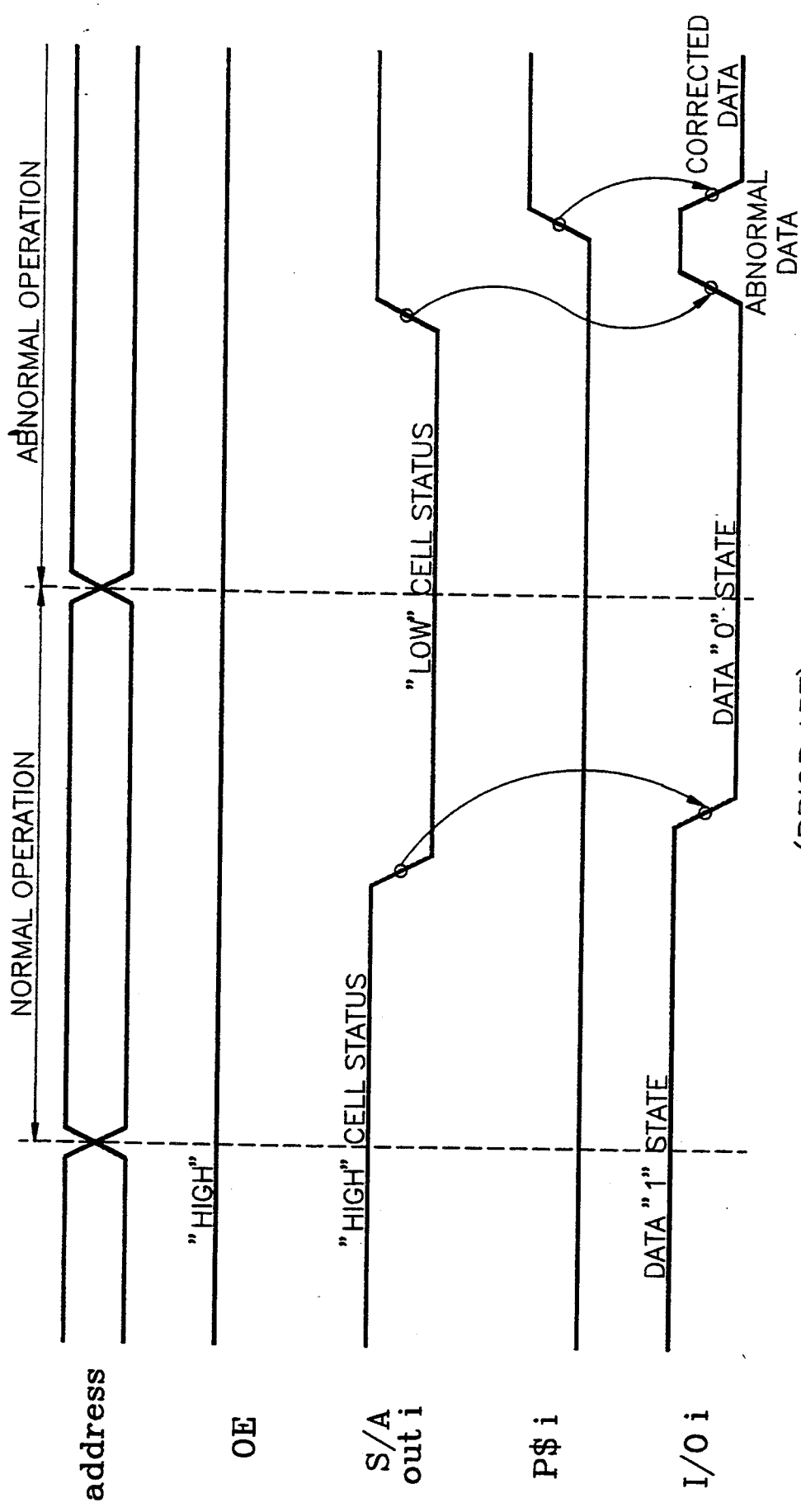
FIG. 2 is a timing chart illustrating operations of the conventional data output control circuit of FIG. 1.

FIG. 2 shows a timing chart illustrating an operation of the data output control circuit of FIG. 1.

In FIG. 1, if an address is applied and the output enable signal OE is provided, a memory cell is selected by the applied address; and the sense amplifiers 31 and 33 sense a state of the selected memory cell. For example, if the state of the selected memory cell is logic "1", the output of the sense amplifier 31 may be logic "1", i.e. logic "high" state, and if the state of the selected memory cell is logic "0", the output of the sense amplifier 31 may be logic "0", i.e. logic "low" state. In this case, the output state of the sense amplifier may differ from that of the memory cell by adjusting the logic level. Moreover, the logic "high" and "low" states are usually a representation of a power voltage level $V_{cc}$ and a ground voltage level $V_{ss}$, respectively. In the case of the data output circuit with the ECC circuit as illustrated in FIG. 1, the output signals S/Ai provided by the sense amplifiers 31 and 33 are transmitted to the ECC circuits 35 and 36 which are a parity generator and a parity decoder respectively. A signal P$i (it may be P$0 or P$1) obtained from the ECC circuit 35 or 36 is applied to a single one of the input terminals of the exclusive OR gates 3 and 18. Hence, the outputs of the exclusive OR gates 3 and 18 are varied in dependence upon the state of the signal P$i. For example, if the memory cell is in a normal state, the signal P$i becomes a logic "low" state, and as a result, the output values of the exclusive OR gates 3 and 18 are equal to those of the sense amplifiers 31 and 33, respectively. If the memory cell is in an abnormal state (i.e. due to current dissipation), the signal P$i exhibits a logic "high" state and the output values of the exclusive OR gates 3 and 18 are opposite to the output signals S/Ai provided by the sense amplifiers 31 and 33, to thereby transmit the output values of the exclusive OR gates 3 and 18 to the exterior of a chip through the data output buffers 40A and 40B. In this manner, the ECC circuits 35 and 36 control the detection and correction of normal or abnormal states of the memory cell. Since the output enable signal OE is continuously set to a logic "high" state, the signal OE always enables the NAND gates 7 and 22, and the NOR gates 8 and 23 of the data output buffers 40A and 40B, so that the transition operation of input/output terminals 32 and 34 is varied in dependence upon the signals provided by the sense amplifiers 31 and 33.

The signals P$O, P$1 generated by ECC circuits 35 and 36 are provided at some selected time delay determined respectively by a plurality of inverters 1, 2 and 16, 17 with respect to the output signal S/Ai provided by the sense amplifiers 31 and 33. Meanwhile, when a chip is operated, an operating current is generated in the chip and increased during a transition between the input data and the output data, i.e., during a swing operation of the data to provide a large amount of operating current at the output terminals 32 and 34. An increase in the operating current due to undesirable variations at the input/output terminals is detrimental to the effectiveness of the chip. The chip may be liable to malfunction. Moreover, the problem is exacerbated if the chip is highly integrated, especially in case of byte wide memory devices having a plurality of input/output terminals (×8, ×16, etc...). Moreover, the deterioration of access time is inevitably propagated in the chip with the normal state and abnormal state corrected by the ECC circuit, or in memory cells with the normal and abnormal states of a single chip due to undesirable variations at the input/output terminals, thereby resulting in low yield.

Figure 3:
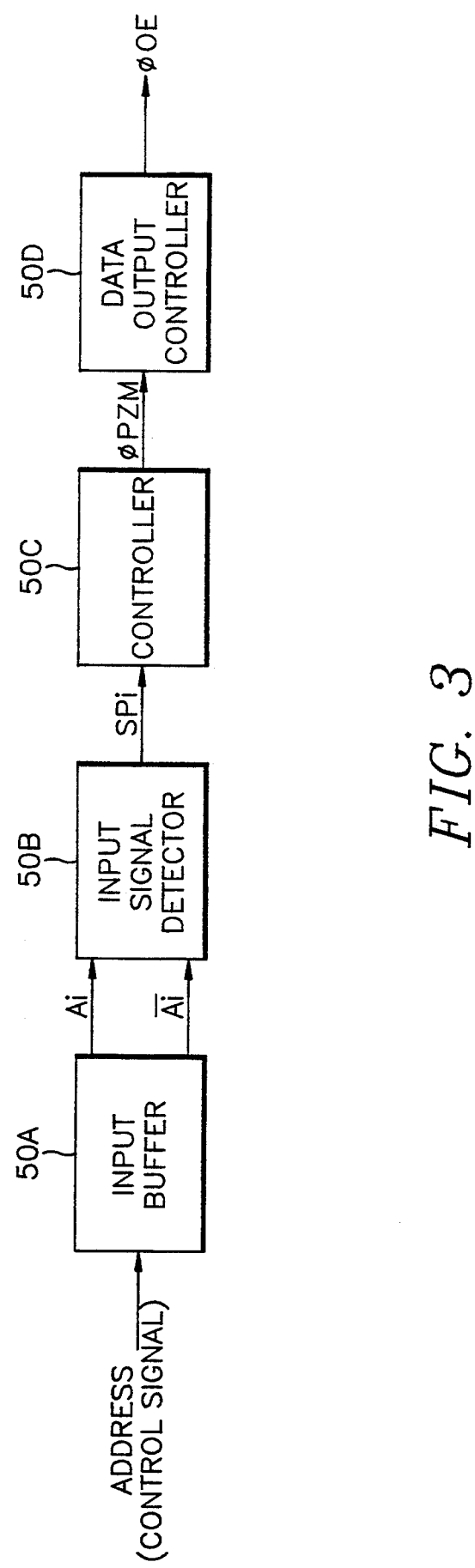
FIG. 3 is a block diagram illustrating control signals of a data output control circuit according to the present invention.

Referring now to FIG. 3, an input buffer 50A receives an external address or control signal generated from the ATD circuit, etc., for buffering the received signal to provide a pair of complementary output signals Ai and Ai. A detector 50B detects a desired signal among the output signals Ai and Ai of the input buffer 50A. A controller 50C receives an output signal SPi from detector 50B to select a data output buffer for controlling data output controller 50D. The data output controller 50D receives an output signal $\phi$PZM of the controller 50C to generate a driving signal $\phi$OE for driving a data output buffer.

Figure 4:
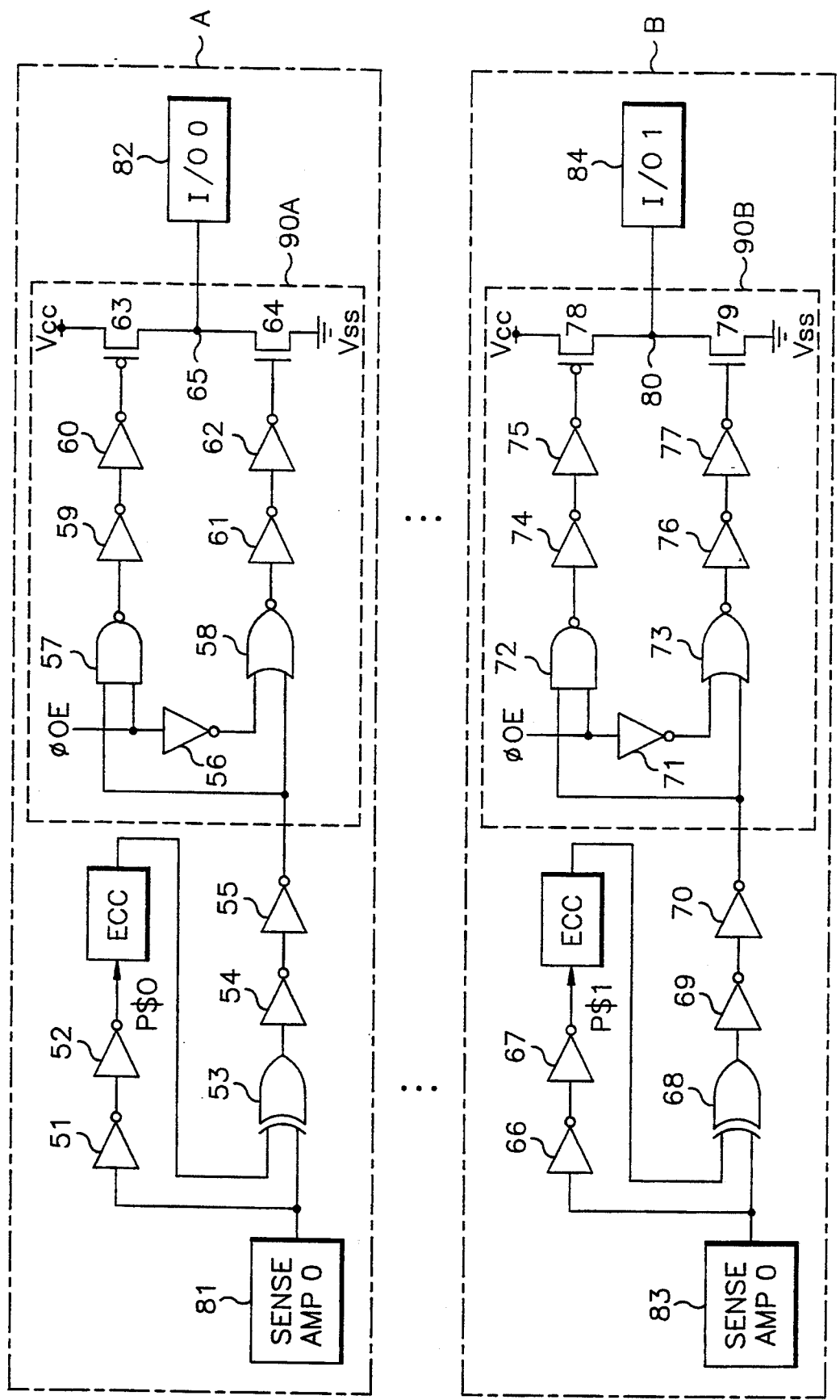
FIG. 4 is a circuit diagram of a data output control circuit according to the present invention.

Referring now to FIG. 4, the data output control circuit, as contemplated by the instant invention, has the same configuration as that of FIG. 1, except that the driving signal $\phi$0E generated from the data output controller 50D (shown in FIG. 5C), and applied to the data output buffers 90A and 90B is different. Although not shown in the drawings, the same error correction code circuit as illustrated in FIG. 1 is also provided, and tile output signals P$0 and P$1 of the error correction code circuits are supplied to one input terminal of exclusive OR gates 53 and 68, respectively. In response to the driving signal $\phi$OE, the operation of the data output control circuit of FIG. 4 is quite different from that of FIG. 1, as will be described in detail below.

Figure 5A:
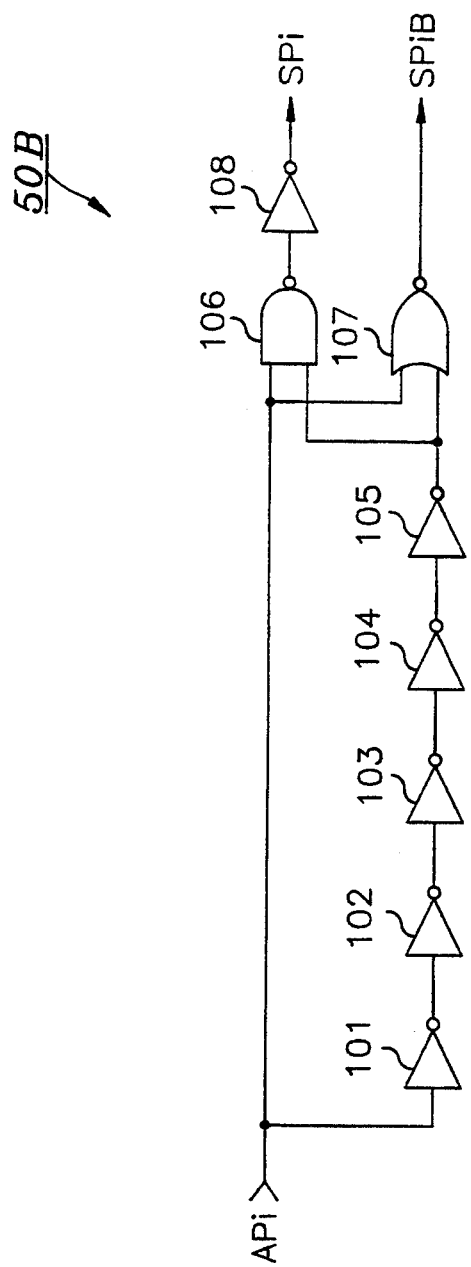
FIGS. 5A to 5C are detailed circuit diagrams illustrating block diagrams of FIG. 3.
Figure 5B:
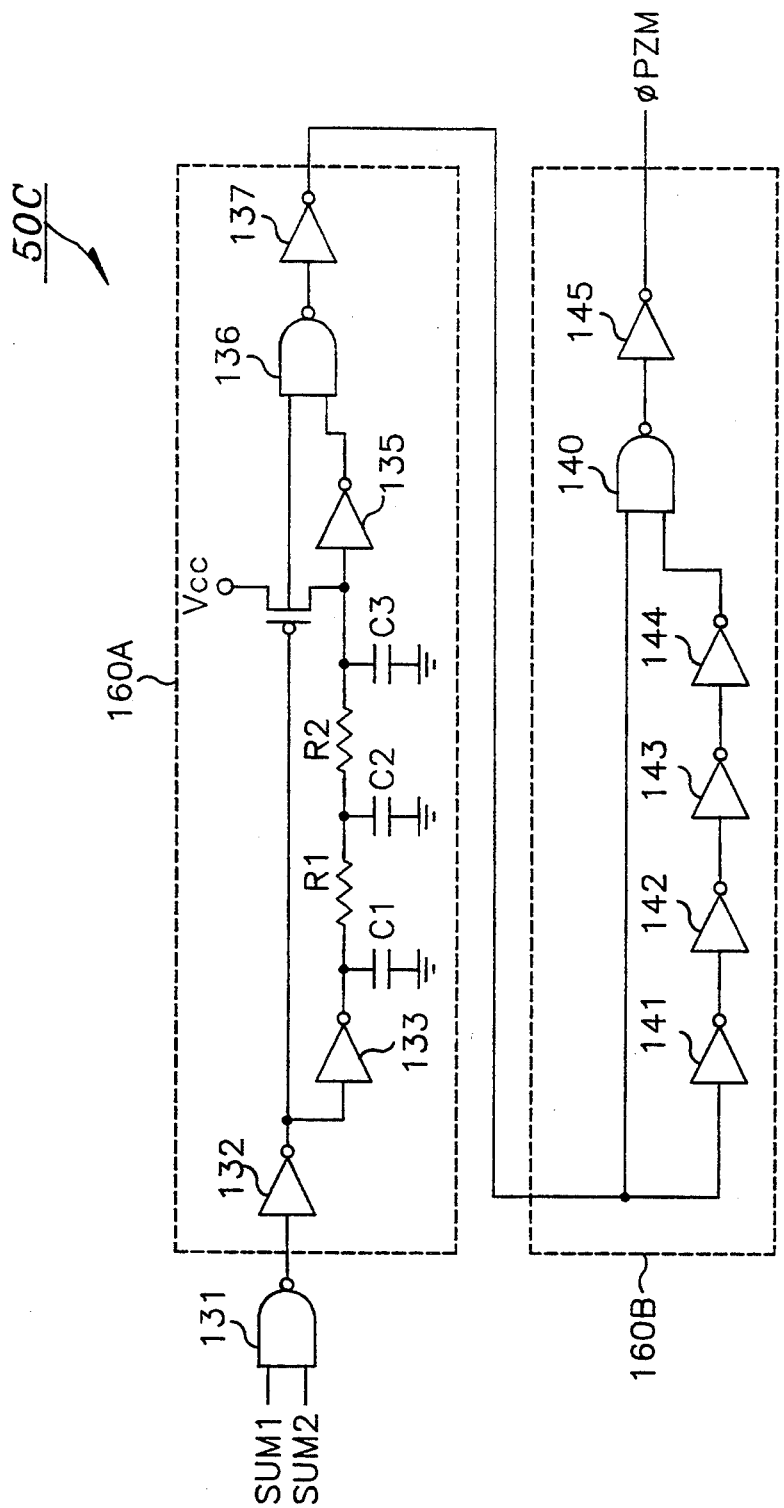
Figure 5C:
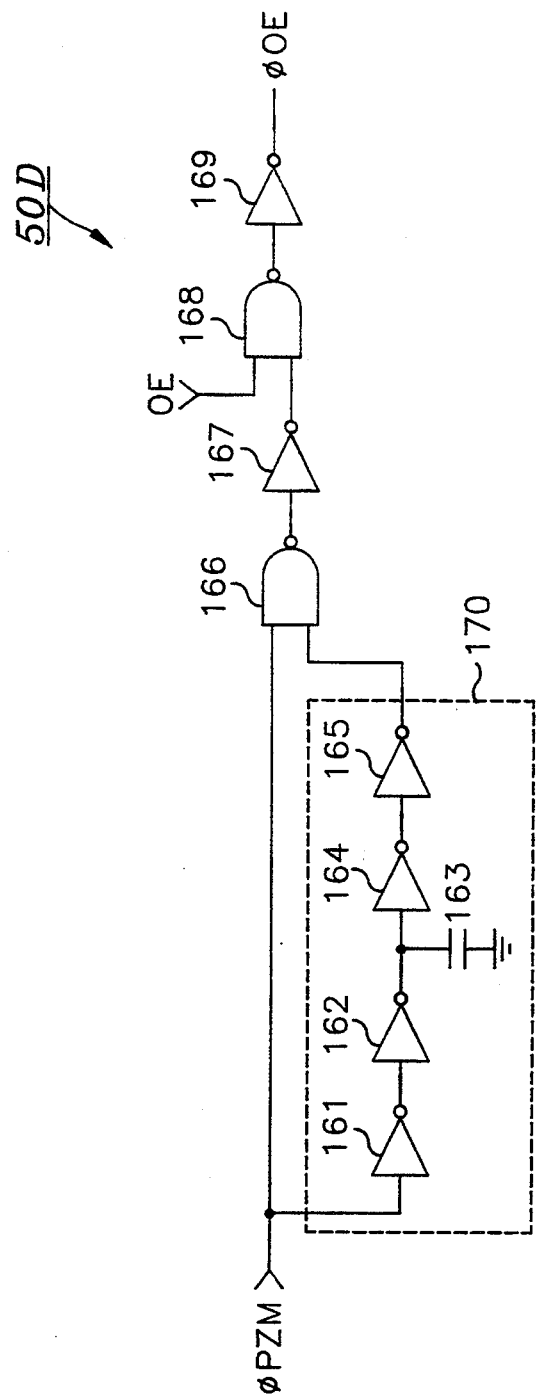

FIGS. 5A to 5C are circuit diagrams illustrating in detail tile detector 50B, controller 50C and data output controller 50D of FIG. 3, respectively.

In FIG. 5A, when a transition of input addresses occurs, a detecting signal is produced from an address transition circuit. Serially connected inverters 101 to 105 are operated as a delay circuit, and output signals SPi and SPiB are produced as pulse signals when transition of an input signal APi occurs. A plurality of circuits having the configuration of FIG. 5A are included in a chip.

Referring now to FIG. 5B, input signals SUM1 and SUM2 are generated only when the output signal SPi shown in FIG. 5A is triggered; and the input signals SUM1 and SUM2 are obtained by combining the output signals SPi, SPiB with the gating circuit formed by NAND gate 106, NOR gate 107 having an input port coupled to a first input port of NAND gate 131, inverter 108 coupled between the output port of NAND gate 106 and a second input port of NAND gate 131.

TABLE I

| AP$_i$ | 106 | 107 | 108 | 131 | 132 |
|---|---|---|---|---|---|
| Constant High | High | Low | Low | High | Low |
| Constant Low | High | Low | Low | High | Low |
| High → Low | High | High | High | Low | High |
| Low → High | Low | Low | High | High | Low |

In other words, as shown by Table I above, the input signals SUM1 and SUM2 are not generated when the output signal SPi is not triggered, and at this time, set to a logic "high" state. The controller 50C as shown in FIG. 3 has a first NAND gate 131, a first signal converter 160A and a second signal converter 160B. The first signal converter 160A has a logic state which produces logic "high" only when the input signals SUM1 and SUM2 are all in logic "high" states. In the first signal converter 160A, inverters 133 and 135 are connected to a second NAND gate 136, capacitors C1, C2 and C3 and resistors R1 and R2 are operated as a delay circuit. Here, it may not matter even if the capacitors C1, C2 and C3 are removed. The second signal converter 160B includes a third NAND gate 140 for receiving the output signal of the first signal converter 160A and a signal generated through four serially connected inverters 141 to 144 from the output signal of the first signal converter 160A, and an inverter 145 for receiving the output signal of the third NAND gate 140 to thereby provide to a given signal $\phi$PZM.

In FIG. 5C, the dam output controller 50D has a fourth NAND gate 166 for receiving the output signal $\phi$PZM of the second signal converter 160B and a signal produced through a delay circuit 170 from the signal $\phi$PZM, an inverter 167 for receiving an output signal of the fourth NAND gate 166, a fifth NAND gate 168 for receiving the output signal of the inverter 167 and an output enable signal OE, and an inverter 169 for receiving the output signal of the fifth NAND gate 168 to provide the driving signal φOE. The delay circuit 170 has four serially connected inverters 161, 162, 164 and 165 and a capacitor 163. The output enable signal OE is generated from the ATD circuit and is always set to logic "high" state. Moreover, the driving signal φOE controls and drives the data output buffer. In the above configuration, the detector 50B of FIG. 5A produces a logic "low" state during a normal operation, and the controller 50C of FIG. 5B is set to logic "high" state during a normal operation. Moreover, the data output controller 50D of FIG. 5C generates a logic "high" state during a normal operation.

Figure 6:
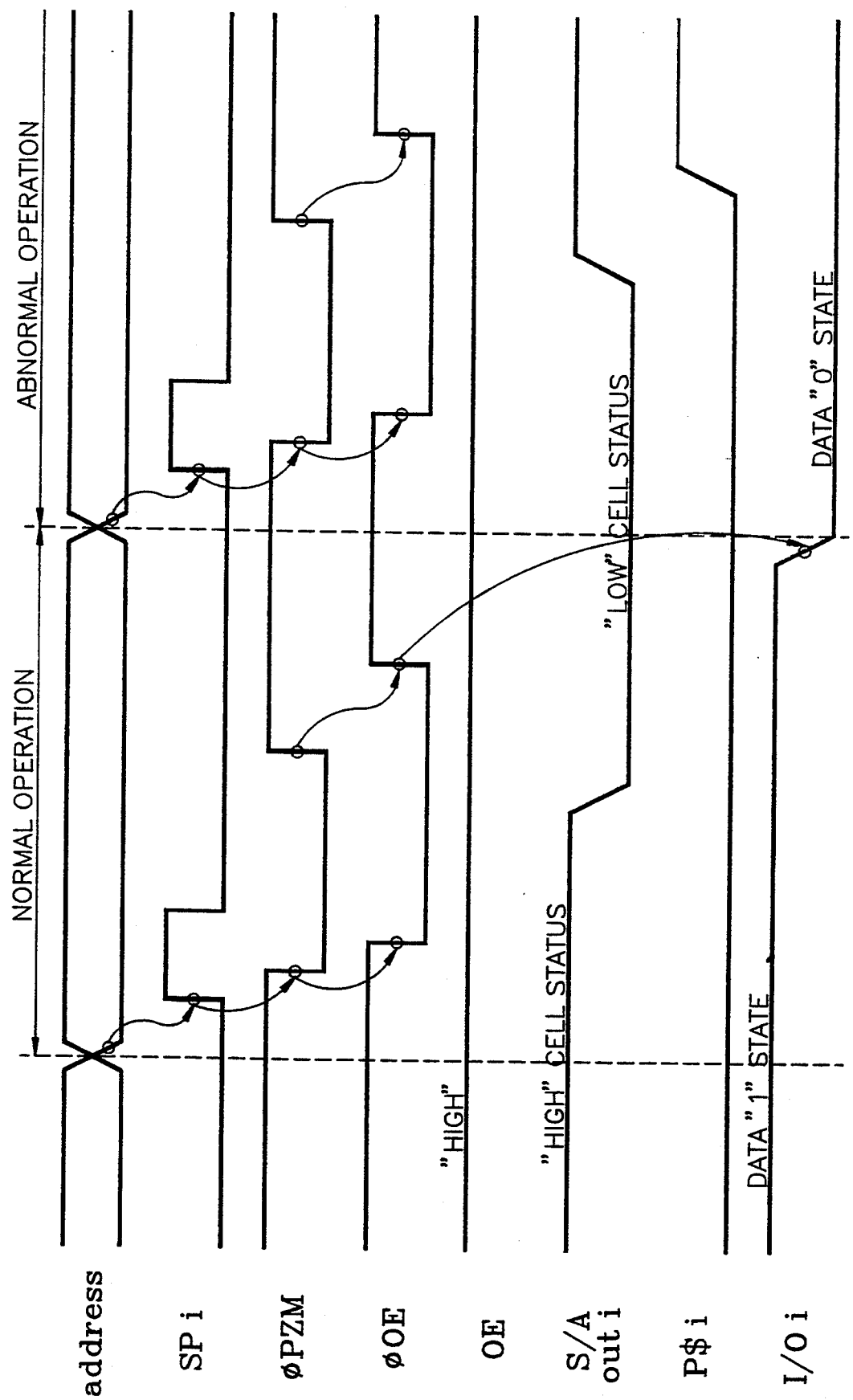
FIG. 6 is a timing chart illustrating operations of the data output control circuit of FIG. 4.

The operating characteristics of the data output control circuit of FIG. 4 constructed on the basis of FIGS. 5A to 5C will now be described with reference to FIG. 6. In this case, it should be noted that, in a data output control circuit, even if data is read out from a memory cell and reaches an input terminal of the data output buffers 90A and 90B through sense amplifiers 81 and 83, tile data is not produced at the exterior of a chip until the output signal φOE of the data output controller 50D of FIG. 5C is enabled.

If an input signal is applied from the exterior of a chip and a memory cell is selected, the data of the memory cell is sensed by the sense amplifiers 81 and 83. The output of the data is varied depending on the state of the selected memory cell, i.e. the normal or abnormal state.

First, in case of selecting the memory cell of a normal state, tile output processes of the data are described hereinafter. In this case, the signals SPi, φPZM and φOE are produced by the external input signal through the circuits as shown in FIGS. 5A to 5C. The driving signal φOE is delayed for a delay time by the delay circuit 170 as shown in FIG. 5C having a concatenation of four successive inverters. Accordingly, the driving signal 4,0E is enabled at the time when memory cell data output from the exclusive OR gates 53 and 68 through the sense amplifiers 81 and 83 and an ECC circuit (not shown) is applied to the data output buffers 90A and 90B. The delay time can be varied by adjusting capacitance of the capacitor 163 or the number of the inverters 161 to 165 shown in FIG. 5C. Since the memory cell is in a normal state, the output values of the exclusive OR gates 53 and 68 are identical to the outputs of the sense amplifiers 81 and 83, and are transmitted to NAND gates 57 and 72 and NOR gates 58 and 73 of the data output buffers 90A and 90B. And then, after the signal φOE is enabled, the data of input/output terminals 82 and 84 is produced as shown in FIG. 6.

Next, in case of selecting the memory cell with an abnormal state, the data output processes of the data are described hereinafter. In this case, the signals SPi, φPZM and φOE are also produced by the external input signal through the circuits shown in FIGS. 5A to 5C. The dam of the memory cell with the abnormal state passes through the ECC circuit, and the output value of the ECC circuit is opposite to the data from a memory cell in the normal state, consequently the output values of the exclusive OR gates 53 and 68 are opposite to the output of the sense amplifiers 81 and 83. And then, after the signal φOE is enabled, the output values of the exclusive OR gates 53 and 68 are produced as corrected data through the data output buffers 90A and 90B. In FIG. 2, the data of the input/output terminal is varied whenever the output of the exclusive OR gates is varied. In the above-described preferred embodiment, however, the data of the input/output terminals 90A and 90B is accurately varied only when the signal φOE is changed. Therefore, unnecessary variation during operation is removed, and even if the data of the memory cell is the corrected data provided by the ECC circuit, the same access time with the normal data of the memory cell is obtained.

As described above, in a data output circuit, since a data output buffer does not perform the unnecessary transition operation by adjusting the enabled time of the driving signals of the data output buffer, current dissipation can be suppressed and the deterioration of data access time can be prevented, thereby improving the yield of a chip.

While a preferred embodiment of the invention has been particularly shown and described, it will be understood by those skilled in the art that foregoing and other changes in form and details may be made without departing from the spirit and scope of the present invention.

What is claimed is:

1. A semiconductor memory device comprising:
   an error correcting code circuit for providing corrected data to an output buffer for correcting memory cells defected by undesired data transitions; and
   a data output control circuit for controlling output of said corrected data from said output buffer to an output terminal by providing a driving signal to said output buffer, said data output control circuit comprising:
   signal detector means coupled to receive an external buffered signal, for detecting transitions of said external buffered signal indicative of said undesired data transitions, said signal detector means providing first and second detected signals representative of the transitions of said external buffered signal, said signal detector means comprising:
   first delay means for delaying said external buffered signal for a first predetermined delay period to provide a first delayed signal;
   first NAND gate means for logically combining said external buffered signal and said first delayed signal to provide a first intermediate signal;
   first inverter means for inverting said first intermediate signal to provide a first inverted signal indicative of said first detected signal; and
   NOR gate means for logically combining said external buffered signal and said first delayed signal to provide said second detected signal;
   first controller means coupled to receive said first and second detected signals, for selecting said output buffer from a plurality of output buffers by providing a control signal indicative of a selected output buffer; and
   second controller means coupled to receive said control signal, for providing said driving signal in dependence upon said control signal to drive the selected output buffer.

2. The semiconductor memory device as claimed in claim 1, wherein said selected output buffer provides said corrected data after said driving signal from said second controller means is enabled.

3. The semiconductor memory device as claimed in claim 1, wherein said first controller means comprises:

second NAND gate means coupled to receive said first and second detected signals, for logically combining said first and second detected signals to provide a second intermediate signal;

first converter means for providing a triggered signal in response to said second intermediate signal; and second converter means for providing said control signal in response to said triggered signal.

4. The semiconductor memory device as claimed in claim 3, wherein said first converter means comprises:

second inverter means for inverting said second intermediate signal to provide a second inverted signal;

third inverter means for inverting said second inverted signal to provide a third inverted signal;

fourth inverter means for inverting said third inverted signal via a plurality of R-C circuits to provide a fourth inverted signal; and third NAND gate means for logically combining said fourth inverted signal and said second inverted signal via a transistor to provide said triggered signal.

5. The semiconductor memory device as claimed in claim 4, wherein said second controller means comprises:

second delay means for delaying said control signal for a second predetermined delay period to provide a second delayed signal;

fourth NAND gate means for logically combining said control signal and said second delayed signal to provide a third intermediate signal;

fifth inverter means for inverting said third intermediate signal to provide a fifth inverted signal; and sixth NAND gate means for logically combining said fifth inverted signal and an output enable signal to provide said driving signal during an enabling period.

6. A semiconductor memory device as claimed in claim 5, wherein said enabling period of said driving signal is controlled by said second predetermined delay period.

7. A semiconductor memory device having an error correcting code circuit for providing corrected data to a data output buffer for correcting an undesired transition of data stored in a memory cell and a data output control circuit for enabling said corrected data to be output from said data output buffer by providing a driving signal to said data output buffer, said corrected data being transmitted to said data output buffer via said error correcting code circuit, said data output control circuit comprising:

first delay means for delaying an external buffered signal for a first delay period to provide a first delayed signal;

first NAND gate means for logically combining said external buffered signal and said first delayed signal to provide a first detected signal representative of a transition of said external buffered signal, said transition of said external buffered signal indicative of said undesired transition of data;

NOR gate means for logically combining said external buffered signal and said first delayed signal to provide a second detected signal;

second NAND gate means for logically combining said first and second detected signals to provide a first intermediate signal;

first converter means for providing a triggered signal in response to said first intermediate signal;

second converter means for providing a control signal representative of a designated output buffer in dependence upon said triggered signal;

second delay means for delaying said control signal for a second delay period to provide a second intermediate signal;

inverter means for inverting said second intermediate signal to provide an inverted signal; and fourth NAND gate means for logically combining said inverted signal and an output enable signal to provide said driving signal during an enable period for driving said data output buffer.

8. The semiconductor memory device as claimed in claim 7, wherein said data output buffer provides corrected data when said driving signal is enabled.

9. The semiconductor memory device as claimed in claim 7, wherein said enabling period of said driving signal is controlled by said second delay period.

10. A method for enabling transfer of corrected data from a data output buffer to an external source in a semiconductor memory device having an error correcting code circuit for providing said corrected data to remedy an undesired data transition in a memory cell, and a data output control circuit for enabling said corrected data to be transferred from said data output buffer by providing a driving signal to said data output buffer, said corrected data being transmitted to said data output buffer via said error correcting code circuit, said method comprising the steps of:

delaying an external buffered signal for a first delay period to provide a first delayed signal;

logically combining said external buffered signal and said first delayed signal to provide first and second detected signal representative of a transition of said external buffered signal, said transition of said external buffered signal indicative of said undesired data transition in said memory cell;

logically combining said first and second detected signals to provide a first intermediate signal;

providing a triggered signal in response to said first intermediate signal;

providing a control signal representative of a designated output buffer in dependence upon said triggered signal;

delaying said control signal for a second delay period to provide a second delayed signal;

logically combining said control signal and said second delayed signal to provide a second intermediate signal;

inverting said second intermediate signal to provide an inverted signal; and logically combining said inverted signal and an output enable signal to provide said driving signal during an enable period for enabling said data output buffer to transfer said corrected data.

11. The method for enabling transfer of corrected data from a data output buffer to an external source as claimed in claim 10, wherein said data output buffer transfers said corrected data when said driving signal is enabled.

12. The method for enabling transfer of said corrected data from a data output buffer to an external source as claimed in claim 10, wherein said enabling period of said driving signal is controlled by said second delay period.

13. A semiconductor memory device comprising:

an error correcting code circuit for providing corrected data by detecting and correcting a memory cell defected by an undesired data transition; and a data output control circuit for controlling output of said corrected data from an output buffer to an output terminal, said data output control circuit comprising:

signal detector means coupled to receive an external buffered signal, for detecting a transition of said external buffered signal indicative of said undesired data transition, said signal detector means providing first and second detected signals indicative of the transition of said external buffered signal, said signal detector means comprising:

first delay means for delaying said external buffered signal for a first predetermined delay period to provide a first delayed signal;

first NAND gate means for logically combining said external buffered signal and said first delayed signal to provide a first intermediate signal;

first inverter means for inverting said first intermediate signal to provide a first inverted signal indicative of said first detected signal; and NOR gate means for logically combining said external buffered signal and said first delayed signal to provide said second detected signal;

first controller means coupled to receive said first and second detected signals, for selecting said output buffer from a plurality of output buffers by providing a control signal indicative of a selected output buffer, said first controller means comprising:

second NAND gate means coupled to receive said first and second detected signals, for logically combining said first and second detected signals to provide a second intermediate signal;

first converter means for providing a triggered signal in response to said second intermediate signal; and second converter means for providing said control signal in response to said triggered signal; and second controller means coupled to receive said control signal, for providing a driving signal in dependence upon said control signal to drive the selected output buffer, said second controller means comprising:

second delay means for delaying said control signal for a second predetermined delay period to provide a second delayed signal;

third NAND gate means for logically combining said control signal and said second delayed signal to provide a third intermediate signal;

second inverter means for inverting said third intermediate signal to provide a second inverted signal; and fourth NAND gate means for logically combining said second inverted signal and an output enable signal to provide said driving signal during an enabling period.

14. The semiconductor memory device as claimed in claim 13, wherein said selected output buffer provides corrected data after said driving signal from said second controller means is enabled.

15. The semiconductor memory device as claimed in claim 13, wherein said first converter means comprises:

third inverter means for inverting said second intermediate signal to provide a third inverted signal;

fourth inverter means for inverting said third inverted signal to provide a fourth inverted signal;

fifth inverter means for inverting said fourth inverted signal via a plurality of R-C circuits to provide a fifth inverted signal; and fifth NAND gate means for logically combining said fifth inverted signal and said third inverted signal via a transistor to provide said triggered signal.

16. A semiconductor memory device as claimed in claim 13, wherein said enabling period of said driving signal is controlled by said second predetermined delay period.

17. A data output control circuit for controlling output of data from an output buffer to an output terminal by providing a driving signal to said output buffer, said data output control circuit comprising:

signal detector means coupled to receive an external buffered signal, for detecting transitions of said external buffered signal indicative of undesired data transitions within a memory cell, said signal detector means providing first and second detected signals representative of the transitions of said external buffered signal;

first controller means coupled to receive said first and second detected signals, for selecting said output buffer from a plurality of output buffers by providing a control signal indicative of a selected output buffer; and second controller means coupled to receive and delay said control signal, for providing said driving signal in dependence upon said control signal to drive the selected output buffer.

18. The data output control circuit as claimed in claim 17, further comprising an error correcting code circuit for providing corrected data to said output buffer for correcting said memory cell detected by said undesired data transitions.

19. The data output control circuit as claimed in claim 17, further comprised of an enabling period of said driving signal being controlled by the delay of said control signal.

* * * * *

UNITED STATES PATENT AND TRADEMARK OFFICE
CERTIFICATE OF CORRECTION

PATENT NO. : 5,357,530

DATED : October 18, 1994

INVENTOR(S) : Hyong-Gon Lee and Sung-Hee CHO

It is certified that error appears in the above-indentified patent and that said Letters Patent is hereby corrected as shown below:

Column 2,    line 9, change "tile" to --the--;

line 11, change "tile" to --the--, line 34, change "title" to --the--.

Column 4,    line 6, change "tile" to --the;

line 14, change "tile" to --the--, line 62, change "dam" to --data--.

Column 5,    line 22, change "tile" to --the--;

line 38, change "4,OE" to --$\phi$OE--, line 57, change "dam" to --data".

Signed and Sealed this

Twenty-third Day of May, 1995

Attest:

BRUCE LEHMAN

*Attesting Officer*        *Commissioner of Patents and Trademarks*